United States Patent [19]

Ito et al.

[11] Patent Number: 5,130,531
[45] Date of Patent: Jul. 14, 1992

[54] REFLECTIVE PHOTOSENSOR AND SEMICONDUCTOR LIGHT EMITTING APPARATUS EACH USING MICRO FRESNEL LENS

[75] Inventors: Yoshinori Ito, Takatsuki; Koichi Imanaka, Kyoto; Hiroshi Sekii, Ibaraki; Shiro Ogata, Kyoto; Hiroshi Goto, Yamatokooriyama, all of Japan

[73] Assignee: Omron Corporation, Kyoto, Japan

[21] Appl. No.: 533,764

[22] Filed: Jun. 6, 1990

[30] Foreign Application Priority Data

Jun. 9, 1989 [JP] Japan ................................. 1-147928
Aug. 21, 1989 [JP] Japan ................................. 1-215208
Oct. 27, 1989 [JP] Japan ................................. 1-280357

[51] Int. Cl.⁵ .................. H01J 3/14; G02B 27/44; H01L 31/12
[52] U.S. Cl. .................................... 250/216; 357/19; 359/565
[58] Field of Search ............ 250/216, 239, 201.5, 250/211 J, 552; 350/162.16, 162.11, 452; 357/19, 17, 74, 30 M

[56] References Cited

U.S. PATENT DOCUMENTS

| | | | |
|---|---|---|---|
| 3,668,404 | 6/1972 | Lehovec | 250/211 R |
| 3,763,372 | 10/1973 | Fedotowsky et al. | 250/237 G |
| 4,689,652 | 8/1987 | Shimada et al. | 357/30 M |
| 4,733,067 | 3/1988 | Oinoue et al. | 250/216 |
| 4,733,943 | 3/1988 | Suzuki et al. | 350/162.2 |
| 4,737,447 | 4/1988 | Suzuki et al. | 350/452 |
| 4,808,812 | 2/1989 | Tanaka et al. | 250/216 |
| 4,842,633 | 6/1989 | Kuribayashi et al. | 350/162.11 |
| 4,880,974 | 11/1989 | Yamakawa | 250/216 |
| 4,933,729 | 6/1990 | Soejima et al. | 357/19 |
| 4,972,089 | 11/1990 | Stevenson | 250/216 |

OTHER PUBLICATIONS

Y. Ito, S. Ogata and K. Imanaka "Minimized Reflective Photomicrosensor with Micro Fresnel Lens" 1989 Autumn National Conv. Record, The Institute of Electronics, Information and Communication Engineers, Part 4, Communications.Electronics, C-196, Sep. 12-15, 1989, Yokohama.

*Primary Examiner*—David C. Nelms
*Assistant Examiner*—Michael Messinger
*Attorney, Agent, or Firm*—Dickstein, Shapiro & Morin

[57] ABSTRACT

In a reflective photosensor in which a light emitting element and a light receiving element are disposed in a mold resin, a planar optical element (micro Fresnel lens) including a first lens section for projecting a light emitted from the light emitting element toward a sense object in an external space and a second lens section for introducing a reflection light reflected from the sense object to the light receiving element is arranged in the mold resin. Favorably, the light emitting element is a light emitting diode of an edge emitting type and is set in a posture in which the element lies on its side. A reflection mirror is disposed in the model resin to introduce a light emitted from the light emitting diode to the first lens section.

25 Claims, 15 Drawing Sheets

REFLECTIVE PHOTOSENSOR AND SEMICONDUCTOR LIGHT EMITTING APPARATUS EACH USING MICRO FRESNEL LENS

BACKGROUND OF THE INVENTION

1. Field of the Invention

The present invention relates to a reflective photosensor and a semiconductor light emitting apparatus each employing a micro Fresnel lens.

2. Description of Related Art

FIG. 22 illustratively shows an example of an reflective photosensor in which a light emitting element and a light receiving element are disposed in a housing or an armouring of the photosensor.

The configuration of the reflective photo sensor includes a light emitting element 102 such as a light emitting diode, a light receiving element 103, for example, a light receiving diode, a focusing lens 104 for the light emitting element 102, and a focusing lens 105 for the light receiving element 103. The constituent components are disposed in a mold resin structure 106 as an armouring or a housing of the reflective photosensor.

Furthermore, the light emitting element 102, the light receiving element 103, and the lenses 104 and 105 are respectively arranged in an inclined state in the mold resin 106. In consequence, a light emitted from the light emitting element 102 is irradiated from an inclined direction onto an object to be sensed 107. In addition, a light reflected from the object to be sensed 107 with a predetermined angle enters the light receiving element 103.

However, in the structure of the conventional reflective photosensor, the light forcusing lenses 104 and 105 are respectively disposed for the light emitting element 102 and the light receiveing element 103, which hence increases the number of constituent components and the number of assembly steps. Furthermore, the setting of an angle between the light emitting element 102 and the light receiving element 103 as well as an optical axis adjustment of the focus lenses 104 and 105 with respect to the arrangement of the above elements 102 and 103 are required to be carried out in consideration of a distance between the sensor and the object to be sensed 107. As a results, the assembly process becomes complicated.

On the other hand, in an apparatus using a light such as an optical information recording and playback apparatus, a semiconductor light emitting apparatus is employed as a light source of a collimated light or a focused light. FIG. 23 shows an example of a semiconductor light emitting apparatus of this type. In this configuration, a laser diode 111 emits a laser light, which is collimated or focused by a group of aspherical lenses 112 to be radiated as a collimated or focused light. The apparatus of FIG. 23 comprises a monitor photodiode 113 disposed to stabilize the power of the laser light emitted from the laser diode 111.

The conventional semiconductor light emitting apparatus however is attended with the following problems.

Since a group of aspherical lenses are used, the overall size of the system is increased, which results in an heavy weight of the configuration.

Owing to the usage of a laser diode as the light source, a countermeasure for stabilization of the power of light is necessary. Namely, in addition to the monitor diode, there is necessitated an output stabilization circuit including a pre-amplifier, a reference power source for determining a threshold level, a differential amplifier, a power amplifier, etc.

The laser diode has in general a relatively short life; moreover, the reliability thereof is not satisfactory for the system.

In a case where a laser light reflected from a recording medium is adopted as a playback signal light and/or a control light for a tracking servo and a focusing servo, the safety standards are necessarily to be observed. Namely, the user is required to pay great attention to the safety standards in the operation.

SUMMARY OF THE INVENTION

It is therefore an object of the present invention to provide a reflective sensor in which the numbers respectively of constituent parts and assembly steps are reduced and in which the assembly proccess is simplified.

Another object of the present invention is to provide a small-sized semiconductor light emitting apparatus which has a light weight, a long life, and a high reliability; furthermore, which make unnecessary any countermeasure for the stabilization of the power of light and hence is easily handled by the user.

Still another object of the present invention is to provide a semiconductor light emitting apparatus of which the size and the thickness can be much more reduced.

In order to achieve the objects above, according to the present invention, there is provided a reflective photosensor in which a light emitting element and a light receiving element are disposed in an armouring or a housing of the sensor characterized by comprising a planar optical device including a first lens section for projecting an emission light from the light emitting element to an external object to be sensed and a second lens section for conducting a reflection light reflected from the object to be sensed to the light receiving element, said first and second lens sections being integrally formed.

In the reflective photosensor, the housing or armouring thereof may be fabricated with a mold resin so as to thereby configure a single inline structure. Furthermore, in the armouring body of the mold resin, lens sections of the planar optical device may be integrally formed in portion respectively associated with a light emitting surface of the light emitting element and a light receiving surface of the light receiving element.

With the provision of the constitution above, the light emitted from the light emitting element is projected through the first lens section of the planar optical device onto an external object to be sensed. On the other hand, the light reflected from the object to be sensed is transmitted via the second lens section of the planar optical device to be conducted into and to be received by the light receiving element in the armouring.

In accordance with the present invention, since two lens sections are integrally formed in a planar optical device, the numbers repectively of parts and assembly steps are minimized. Moreover, thanks to the adoption of the planar optical device, the optical axes can be easily aligned to each other.

The semiconductor light emitting apparatus in accordance with the present invention is configured with a micro Fresnel lens and a light emitting diode of an edge emitting type which is combined with the lens, said light emitting diode having a central wavelength in the vicinity of a design wavelength of the micro fresnel lens.

As a light source, not an ordinary light emitting diode but a light emitting diode of an edge emitting type with a central wavelength in the vicinity of a design wavelength of the micro Fresnel lens is employed. In consequence, a combination of the micro Fresnel lens with the light emitting diode of the edge emitting type becomes to be possibe. Resultantly, an emission light is obtained with a quite small emission diameter like in a case of a laser diode; moreover, a predetermined optical characteristic can be developed. The selection between a collimated light or a focused light for the emission light is determined depending on a distance between the micro Fresnel lens and a light emitting point of the light emiting diode of the edge emitting type.

Since a light emitting diode of an edge emitting type having a central wavelength in the vicinity of a design wavelength of the micro Fresnel lens is utilized as the light source, an emission light is attained with a quite small emission diameter in an order developed in a case of a laser diode; furthermore, a predetermined optical characteristic can be obtained. Namely, there can be implemented a semiconductor light emitting apparatus suitable for the recording and the playback of optical information. Thanks to the combination of the micro Fresnel lens with the light emitting diode of the edge emitting type, the following advantages are also attained.

A micro fresnel lens is adopted as a lens to collimate or to focus an emission light, the size and weight of the apparatus can be remarkably reduced as compared with the conventional example utilizing a group of aspherical lenses.

The light emitting diode of the edge emitting type has a longer life and a higher reliability when compared with the laser diode.

Since the light emitting diode of the edge emitting type make unnecessary the stabilization countermeasure required in the case of the laser diode, the overall constitution of the apparatus can be simplified.

The light emitting diode of the type above is not attended with the problem of observation of the safety standard, which are required to be observed in the case of the laser diode. Consequently, the operability of the apparatus-is improved.

In accordance with the present invention, there is provided a semiconductor light emitting apparatus including a package manufactured with an optically transparent resin with an external contour being substantially in a flat parallelepiped, a light emitting element disposed in the package, lead terminals electrically connected to electrodes of the light emitting element and arranged to be projected from an edge surface of the package into an external space, and a Fresnel lens disposed in an upper surface of the package to conduct a light emitted from the light emitting element to an external space characterized in that a light emitting element of an edge emitting type which emits a light from an edge thereof is adopted as the light emitting element, that the light emittinf diode is arranged in the package in a state or posture in ehich the emission light thereof is substantially parallel to the upper surface of the package, and that reflect means is disposed in the package for reflecting the light emitted from the edge of the light emitting element toward the micro Fresnel lens.

In the constitution aboev, the light emitted from the edge of the light emitting element of the edge emitting type first propagates in a direction toward an edge surface of the package and is then reflected by the reflect means at an intermediate point of the propagration path thereof so as to be deflected to a direction toward the upper surface of the package where the micro Fresnel lens is disposed. In consquence, the emitted light can be fed via the micro Fresnel lens to an external space.

That is, a chip including the light emitting element of the above type is arranged in the package such that a longitudinal direction of the clip is substantially parallel to the upper surface of the package. Consequently, when compared with the conventional structure in which the chip is disposed in the package in a standing posture or with the longitudinal direction of the chip being substantially vertical to the upper surface of the package, the thickness of the apparatus of the present invention can be reduced.

Namely, in accordance with the present invention, an appropriate state or posture of the light emitting element of the edge emittinf type has been devised; moreover, reflect means is utilized to deflect the direction of the light emitted from the light emitting element arranged in the obtained posture. In consequence, the size of the light emitting apparatus can be resultantly designed to be as small as possible. This particularly contributes to minimization of the configuration of variou kind of electronic apparatus and devices employing the semiconductor light emitting apparatus in accordance with the present invention.

BRIEF DESCRIPTION OF THE DRAWINGS

These and other objects and advantages of the present invention will become aparent by reference to the following description and accompanying drawings wherein:

FIG. 1 is a longitudinal cross-sectional view illustratively showing the reflective photosensor of a hermetically sealed structure;

FIG. 2 is a plan view schematically showing a planar optical element;

FIGS 3 and 4 are schematic diagrams for explaining utilization examples of the reflective photosensor;

FIG. 5 is a perspective view showing a state in which a planar optical element is separated;

FIGS. 6 and 7 are cross-sectional view of the planar optical elements along a longitudinal direction;

FIG. 14 is a partially disassembled view in perspective of the semiconductor light emitting apparatus;

FIG. 15 is a cross-sectional view of the semiconductor light emitting apparatus;

FIG. 16 is a partially disassembled view in perspective of the reflective photosensor in the fifth embodiment;

FIG. 17 is a cross-sectional view of the reflective photosensor;

FIG. 18 is a partially disassembled view in perspective of the reflective photosensor;

FIG. 19 is a cross-sectional view of the reflective photosensor;

DESCRIPTION OF THE PREFERRED EMBODIMENTS

FIGS. 1 to 4 show an embodiment of a reflective photosensor in accordance with the present invention. The configuration of this embodiment is associated with an example of a reflective photosensor constituted in a so-called hermetically sealed structure.

Figure 1:
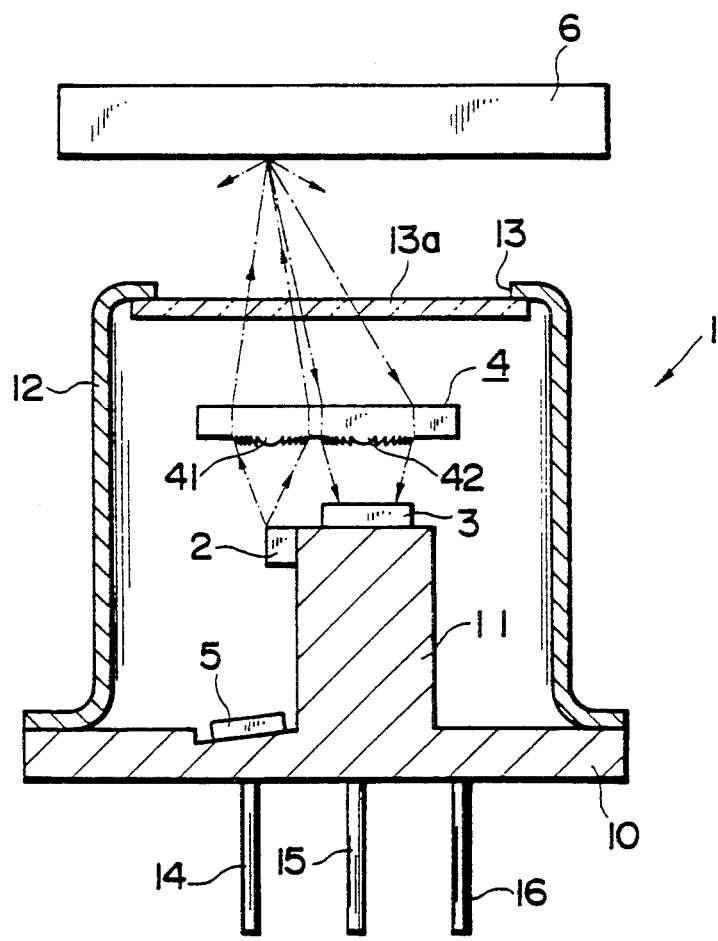
FIGS. 1 to 4 are diagrams associated with an embodiment of a effective photsensor in accordance with the present invention.
Figure 2:
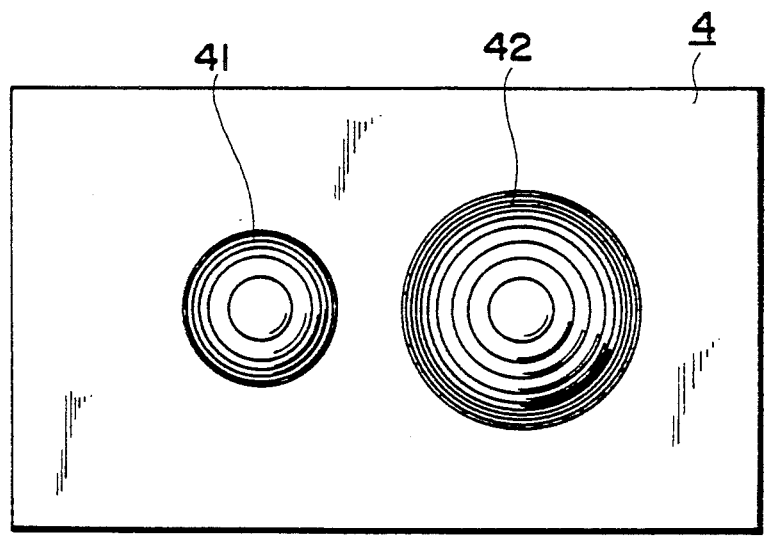

In FIGS. 1 and 2, a reflective photosensor 1 includes a substrate 10 in a disk shape. On a side surface of a projected portion 11 formed in an upper surface of the substrate 10, a light emitting element 2 such as a light emitting diode of an edge emitting type or a semiconductor laser is arranged. On an upper surface of the projection 11 of the substrate 10, a light receiving element 3 such as a photodiode is mounted. A cylindrical cap 12 having an inner circumferential mirror surface is installed on the upper surface of the substrate 10 in order to accomodate therein elements 2 and 3. The cylindrical cap 12 has an opening or window 13 in an upper surface thereof. In this structure, between the window 13 and the elements 2 and 3, an optical element 4 in a shape of a flat plate including Fresnel lens sections 41 and 42 each functioning as a convex lens is supported by means of supporting members not shown. A transparent member 13a of a material such as glass is disposed in the window 13.

The planar optical element 4 is arranged such that the Fresnel lens portions 41 and 42 oppose to the light emitting element 2 and the light receiving element 3, respectively. The substrate 10 of the disk shape and the cylindrical cap 12 constitute the armouring or housing section of the reflective sensor 1. The optical device 4 may also be disposed in the opening 13 of the cylindrical cap 12.

A monitor light receiving element 5 is disposed on the disk-shaped substrate 10 for receiving a light emitted downward from the light emitting element 2. Based on a signal produced from the monitor light receiving element 5, a drive current driving the light emitting element 2 is controlled by use of a control circuit not shown, thereby developing a stable operation of the light emitting element 2. Furthermore, pin-shaped leads 14 to 16 are disposed on the substrate 10. The leads 14 and 15 are connected via respective bonding wires, not shown, to an electrode of the light emitting element 2 and an electrode of the light receiving element 3. The leads 14 and 15 are electrically insulated from the disk-shaped substrate 10. The remaining lead 16 is electrically linked with the substrate 10 to which another electrode of the light emitting element 2 and another electrode of the light receiving element 3 are electically connected.

The light emitting element 2 has a light emitting surface, whereas the light receiving element 3 possesses a light receiving surface. The light emitting and receiving surfaces are oriented to be vertical to an optical axis of the planar optical element 4. In this connection, the light receiving surface is located at a position having a shorter distance to the planar optical element 4 as compared with the light emitting surface. The planar optical element 4 is configured by fixing a resin structure formed in a predetermined Fresnel lens contour onto a transparent substrate of a material such as glass.

The light emitted from the light emitting element 2 is required to be exactly conducted or introduced to a predetermined position of a reflection plate 6 (or a sense object). In consequence, the Fresnel lens portion 41 of the optical element 4 is desirably formed as a high-performance lens having an abberation RMS (root mean square) not exceeding the value of $\lambda/14$. On the other hand, for the Fresnel lens portion 42 associated with the light receiving element 3, a portion of the light reflected from the reflection plate 6 need only be efficiently conducted to the light receiving element 3. Consequently, the Fresnel lens portion 42 is not required to develop a high performance, which is necessary for the Fresnel lens portion 41 associated with the light emitting element 2. Namely, the performance of the Fresnel lens section 42 may be set to a value equal to or less than that of the performance of the Fresnel lens section 41. The lens diameter of the Fresnel lens section 41 for the light emitting element 2 is set to about 500 micrometers, whereas the diameter of the Fresnel lens section 42 of the light receiving element 3 is preferably selected to be a value not less than the diameter of the Fresnel lens 41, thereby collecting the larger amount of the reflected light.

In addition, as for the arrangement of the planar optical element 4, the optical axis alignment need only be achieved with a high precision between the optical axes of the light emitting element 2 and the Fresnel lens section 41. In contrast thereto, such a high precision is not necessarily required for the alignment of the optical axes of the light receiving element 3 and the Fresnel lens section 42. Consequently, when manufacturing these Fresnel lens sections 41 and 42, the positional relationship therebetween need not be controlled with a high precision as above, which facilitates the production of the apparatus.

Subsequently, the operation of the reflective photosensor 1 will be described.

A diffused light irradiated from the light emitting element 2 is focused by use of the Fresnel lens section 41 of the planar optical element 4. The focused light is then projected through the window 13 into an external space where the reflection plate 6 is located. The projected light is then reflected from the reflection plate 6. The reflected light returns to the side of the reflective photosensor 1 while diffusing in the space. In the cylindrical cap 12, a portion of the reflected light is focused by the Fresnel lens section 42 of the planar optical element 4 so as to be fed to the light receiving element 3.

Figure 3:
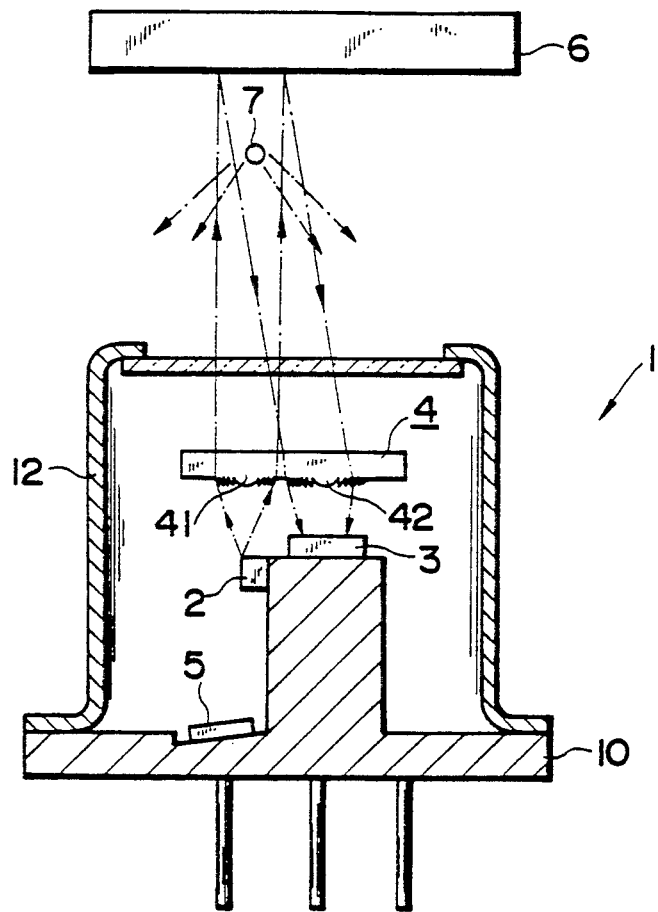

Let us assume here that, as shown in FIG. 3, the Fresnel lens section 41 associated with the light emitting element 2 has a function to collimate the light emitted from the light emitting element 2 in this configuration. In a case where an object 7 exists between the reflection plate 6 and the photosensor 1, when the external contour of the object 7 increases, the amount of the scattered light from the object 7 becomes to be greater and hence the quantity of light received by the light receiving element 3 decreases. Reversely, when the external size of the object 7 becomes to be smaller, the amount of light scattered by the object 7 reduces and the quantity of light received by the light receiving element 3 increases. In short, by beforehand preparing correspondences between the amount of light received by the light receiving element 3 and the size of the object 7, the contour of the object can be measured.

Figure 4:
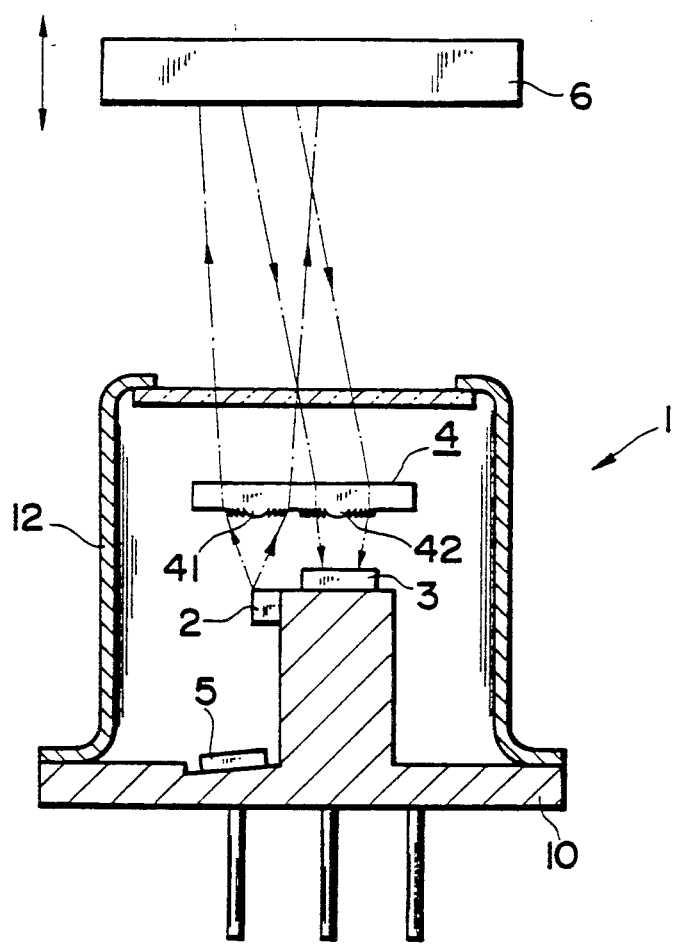

Furthermore, as can be seen from FIG. 4, let us assume that the Fresnel lens section 41 of the light emitting element 2 develops a function to spread the light emitted from the light emitting element 2 in this constitution and that the reflection plate 6 is movably supported in the arrow directions (so as to increase or to decrease the distance to the photosensor 1). Let us consider a case under this condition where the reflection plate 6 is shifted to approach or to leave the reflective photosensor 1. When the distance between the reflection plate 6 and the light emitting element 2 increases, the quantity of light incident to the light receiving element 3 decreases. Reversely, when the distance becomes to be smaller, the incident light receiving element 3 increases. That is, by establishing correspondences in advance between the quantity of the light received by the light receiving element 3 and the distance between the reflective photosensor 1 and the reflection plate 6, the position of the reflection plate 6 with respect to the reflective photosensor 1 can be measured.

As above, when the light receiving surface of the light receiving element 3 is arranged at the location having a shorter distance to the planar optical element 4 as compared with the light emitting surface of the light emitting element 2, the diffused light associated with the light emitted from the light emitting element 2 is prevented from entering the light receiving element 3. This leads to an advantage that the signal-to-noise (S/N) ratio of the electric signal produced from the light receiving element 3 is improved.

Figure 5:
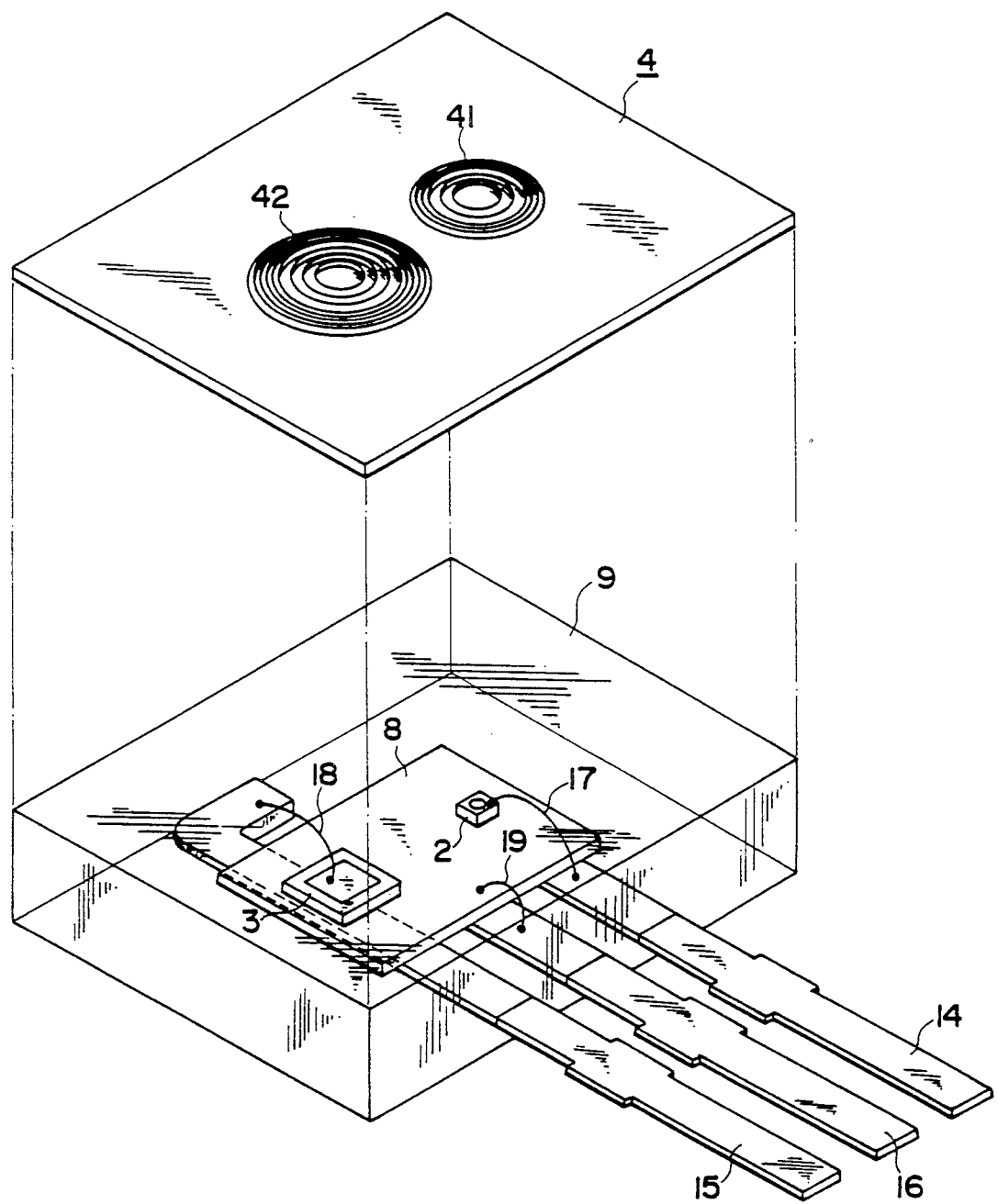
FIGS. 5 to 7 are diagrams respectively showing a reflective photosensor of a single in-line structive in another embodiment of a reflective photosensor in accordance of the present invention.
Figure 6:
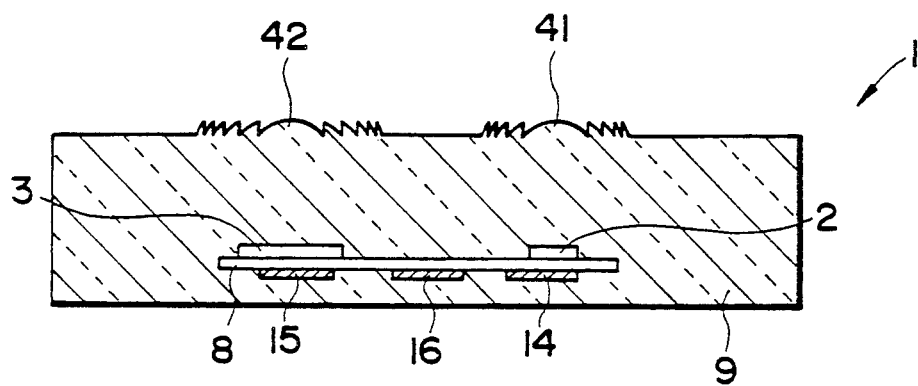
Figure 7:
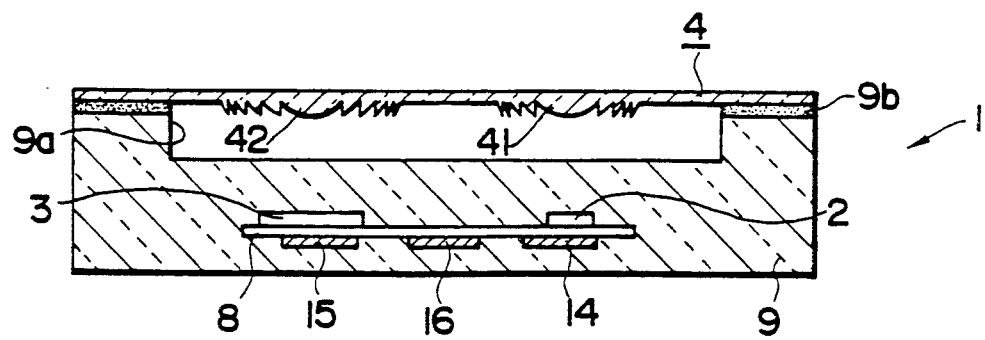

FIGS. 5 to 7 show other embodiments of a reflective photosensor in accordance with the present invention. The configurations of these embodiments are associated with an example in which the armouring or housing body is formed with a mold resin so as to form a single line structure. The light emitting element 2 is implemented by use of a light emitting diode.

More specifically, in either embodiments above, an electrically conductive film or layer (not shown) is formed on an upper surface of an insulating substrate 8 such as a silicon substrate. A light emitting element 2 and a light receiving element 3 are arranged on the conductive layer. On a lower surface of the insulation substrate 8, end portions respectively of band-like leads 14 to 16 are disposed. These constituent components are covered with an optically transparent mold resin 9 such that only other end portions of the leads 14 to 16 are exposed. An electrode of the light emitting element 2 and an electrode of the light receiving element 3 are electrically linked individually via bonding wires 17 and 18 to the leads 14 and 15, respectively. Another electrode of the light emitting element 2 and another electrode of the light receiving element 3 are electrically connected on the central lead 16 via the conductive layer on the insulator substrate 8 and the bonding wire 19.

In the constitution of the embodiment of FIG. 5, onto a surface of the mold resin 9, a planar optical element 4 as shown in FIG. 2 is fixed by use of a transparent resin or the like such that the Fresnel lens sections 41 and 42 face the external space. In the embodiment of FIG. 6, two Fresnel lens sections 41 and 42 are integrally fabricated in a surface of the mold resin 9 at positions respectively associated with the light emitting surface of the light emitting element 2 and the light receiving surface of the light receiving element 3. Moreover, in the structure of the embodiment shown in FIG. 7, a recessed or depressed portion 9a is formed in a surface of the mold resin 9. The planar optical element 4 is bonded by use of a transparent resin 9b or the like onto the mold resin 9 such that the projections (blazes) of the Fresnel lens sections 41 and 42 face the area within the depressed portion 9a. Subsequently, a gas such as $N_2$ is filled in the space of the depression 9a.

As described above, with the provision of the single line structure in the reflective photosensor 1, the apparatus is much more suitable for the mass-production as compared with the above device of the hermetically sealed structure. Moreover, the thickness of the apparatus is further minimized. In addition, the operation to mount the planar optical element 4 on the mold resin 9 is facilitated. Furthermore, in the embodiment of FIG. 6, since the mold resin 9 and the planar optical element 4 are integrally formed, the numbers respectively of the constituent parts and assembly steps can be further reduced. In the constitution of the embodiment shown in FIG. 7, since the projected portions of the Fresnel lens sections 41 and 42 are not exposed to the external space, there does not occur a problem of dusts and dirts accumulated between the projections and there does not exist any fear of damages.

Although in the descriptions of all embodiments above, the lens portions of the planar optical element 4 are configured in the convex Fresnel lens patterns, the present invention is not restricted by these configurations. Namely, a concave Fresnel lens pattern as well as ordinary concave and convex lenses may be employed for the above purposes. However, as already described in conjunction with the foregoing embodiments, in a case where the Fresnel lens patterns are adopted in the lens portions of the planar optical element 4, the focal distance is remarkably decreased as compared with the case of the convex lens. This provision hence considerably contributes to minimization of the overall size of the apparatus.

Subsequently, a description will be given of embodiments of a semiconductor light emitting apparatus in accordance with the present invention.

Figure 8:
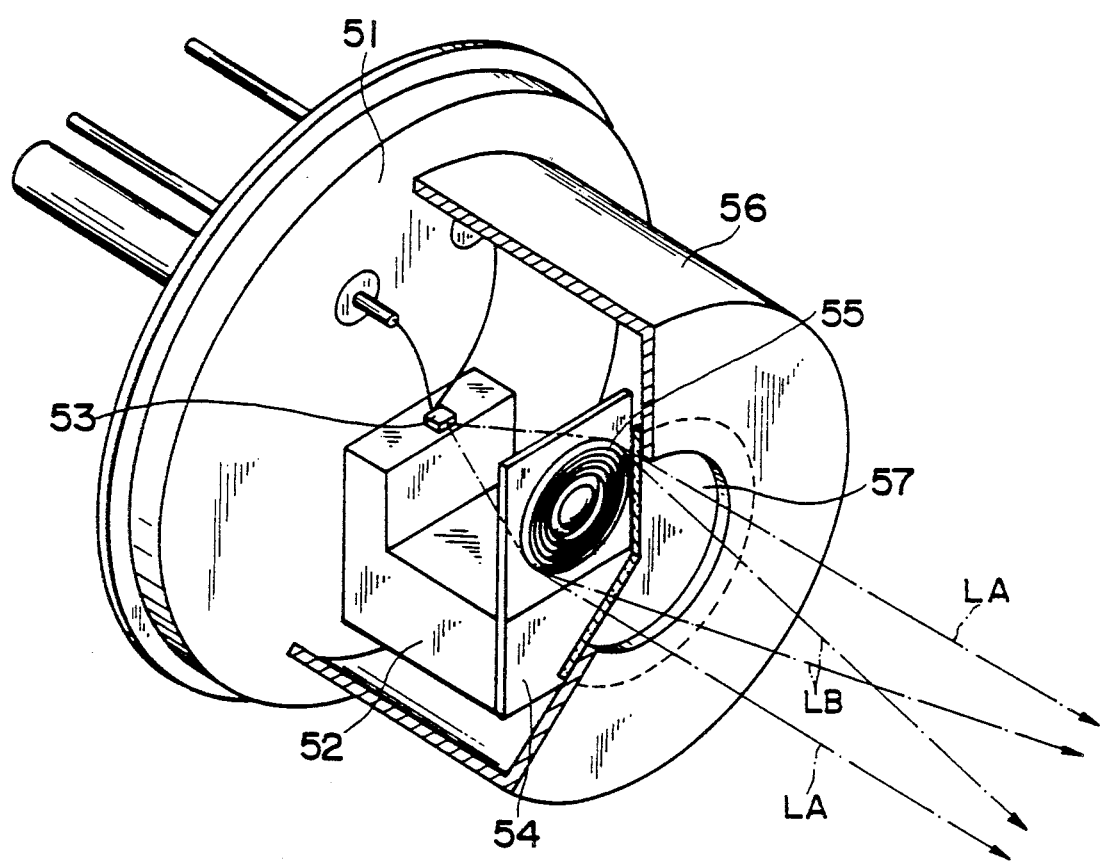
FIG. 8 is a partially cutaway view in perspective of a first embodiment of a semiconductor light emitting apparatus in accordance with the present invention.

FIG. 8 is a partially cutaway view in perspective of a first embodiment of a semiconductor light emitting apparatus in accordance with the present invention.

In this constitution, a heat sink 52 in a shape of a letter L is attached onto a stem 51. On an upper surface of a base of the heat sink 52, a light emitting diode of an edge emitting type 53 is mounted; whereas, on an tip end portion of the heat sink 52, a glass substrate 54 is disposed. A micro Fresnel lens 55 on which a profile is formed by use of a resin of an ultraviolet setting type is bonded onto the glass substrate 54. The micro Fresnel lens 55 is aligned with the photodiode 53 with respect to the respective optical axes.

The light emitting diode of the edge emission type 53 is manufactured to have a central wavelength to be in the proximity of the design wavelength of the micro Fresnel lens 55. In this configuration, owing to a combination of the light emitting diode 53 and the micro Fresnel lens 55, a beam of light is emitted with a quite small diameter in an order developed in a case of a laser diode.

Figure 9:
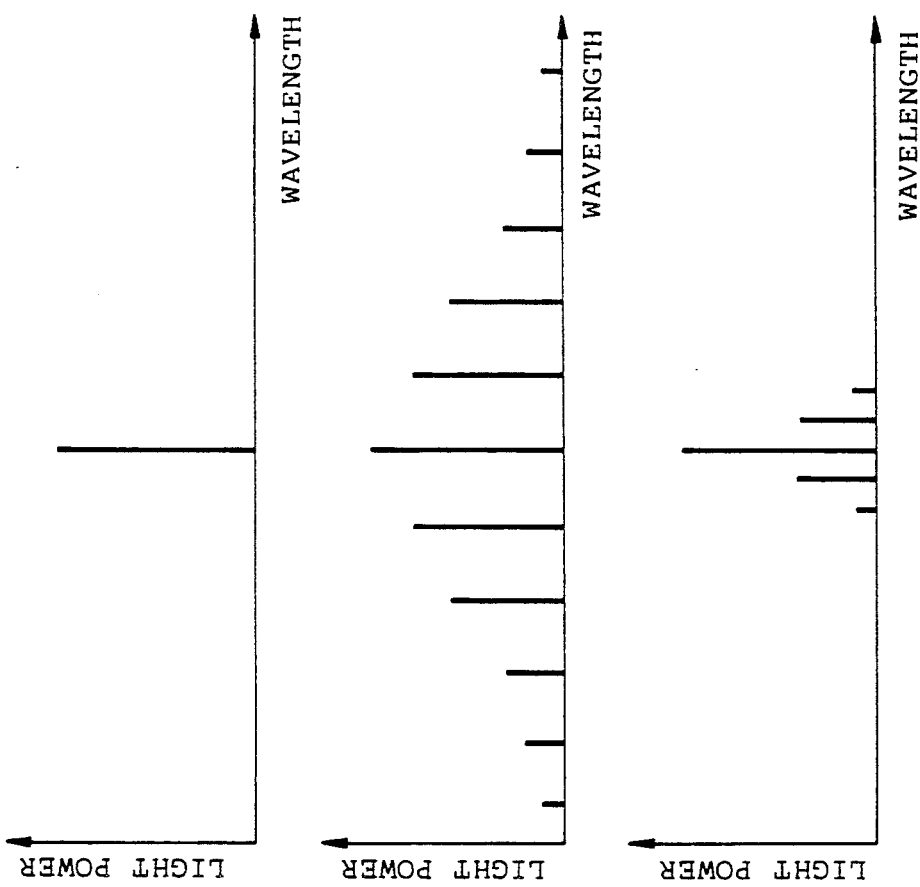
FIGS. 9a, 9b, and 9c are graphs showing spectral distributions of the central wavelength of a laser diode, an ordinary light emitting diode, and a light emitting diode of the edge emitting type, respectively.

FIGS. 9a, 9b, and 9c are graphs showing spectral distributions of the central wavelengths respectively of a laser diode, an ordinary light emitting diode, and a light emitting diode of the edge emission type.

The laser diode emits a beam of light having a single wavelength with a high coherence. In contrast thereto, an ordinary light emitting diode produces an incoherent light having a plurality of wavelengths with a broadened wavelength distribution. The light emitting diode of the edge emission type irradiates a beam of light of which the number of wavelength components is satisfactorily smaller than the number of wavelength components of the ordinary light emitting diode. Moreover, the wavelength distribution is within a quite small range. In consequence, the light emitting diode of the edge emission type 53 can be configured such that the central wavelength thereof is equivalent to the design wavelength of the micro Fresnel lens 55. The beam of light emitted from the light emitting diode of the edge emission type 53 has hence a very small diameter in an order which is developed by the laser diode.

The heat sink 52, the light emitting diode 53, the glass substrate 54, and the micro Fresnel lens 55 are collectively accommodated in a form of a package by use of a metal cap 56 attached on the stem 51. A transparent plate 57 is arranged in an opening or a window of the metal cap 56.

In the semiconductor light emitting apparatus shown in FIG. 8, the distance between the micro Fresnel lens 55 and the light emitting diode 53 of the edge emission type is determined such that the micro Fresnel lens 55 has a focus at a light emitting point of the light emitting diode 53. Namely, the beam of light produced from the light emitting diode 53 passes through the micro Fresnel lens 55 to be collimated (so as to develop parallel light beams) as indicated by LA. When the micro Fresnel lens 55 is disposed at a position where the distance between the light emitting diode 53 and the micro Fresnel lens 55 is smaller than the focal distance of the micro Fresnel lens 55, light beams are focused as denoted by LB.

Figure 10:
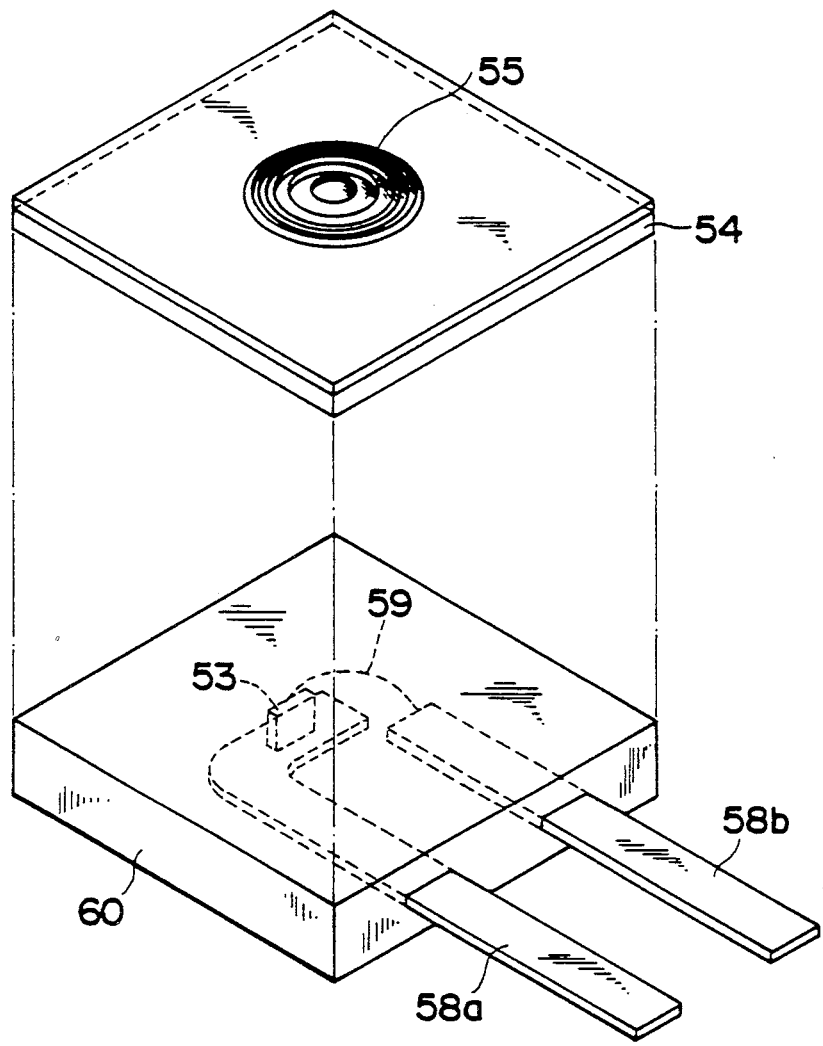
FIG. 10 is a perspective view showing a semiconductor light emitting apparatus associated with a second embodiment in accordance with the present invention.
Figure 11:
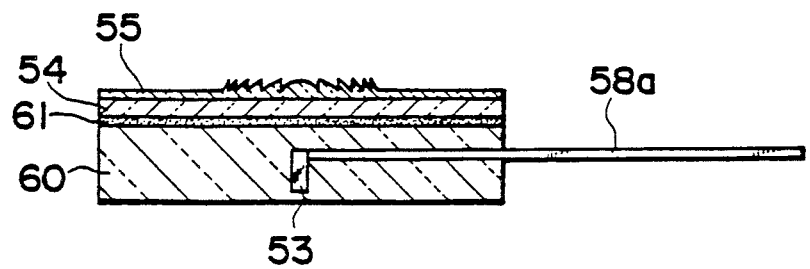
FIG. 11 is a cross-sectional view of the semiconductor light emitting apparatus.

Subsequently, referring to FIGS. 10 and 11, a description will be given of a second embodiment of the semiconductor light emitting apparatus in accordance with the present invention.

In this constitution, a light emitting diode of an edge emitting type 53 has an electrode, which is mechanically and electrically linked with a lead frame 58a, which also functions as a heat sink. The light emitting diode 53 has another electrode, which is connected via a lead wire 59 to a lead frame 58b. The lead frames 58a and 58b are parallel to each other as well as to an end in which a light emitting point of the light emitting diode 53 is found.

The light emitting diode 53, portions of the lead frames 58a and 58b, and the lead wire 59 are disposed in a mold formed with a transparent resin 60. The mold resin 60 is flat along the direction parallel to the lead frames 58a and 58b and has a sufficiently small thickness.

On the other hand, onto a glass substrate 54, a micro Fresnel lens 55 with a profile formed by use of a resin of an ultraviolet setting type is bonded. The glass substrate 54 with the micro Fresnel lens 55 is attached to the mold resin 60 by means of a transparent adhesive agent 61. Through an operation to adjust the thickness of the transparent adhesive agent 61, the light to be emitted from the light emitting diode 53 can be set as a collimated light or a focused light. Since the other constituent components are identical to those of the first embodiment, a description thereof will be avoided.

In the second embodiment, the configuration does not include the stem, and portions of the lead frames 58a and 58b and the light emitting diode 53 are accommodated in the thin mold resin 60. Consequently, as compared with the constitution of the first embodiment, the thickness of the apparatus can be remarkably minimized; furthermore, the size and weight thereof are reduced and the constitution thereof is simplified.

Figure 12:
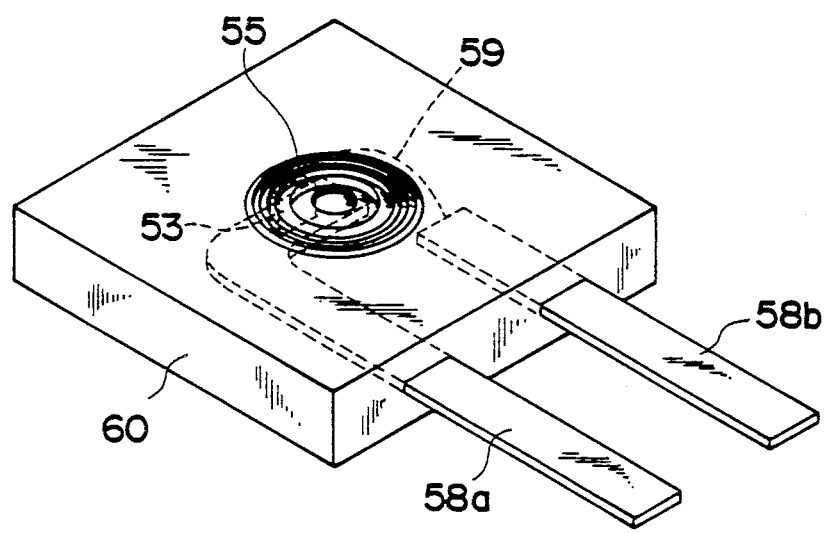
FIG. 12 is a perspective view showing a semiconductor light emitting apparatus associated with a third embodiment in accordance with the present invention.
Figure 13:
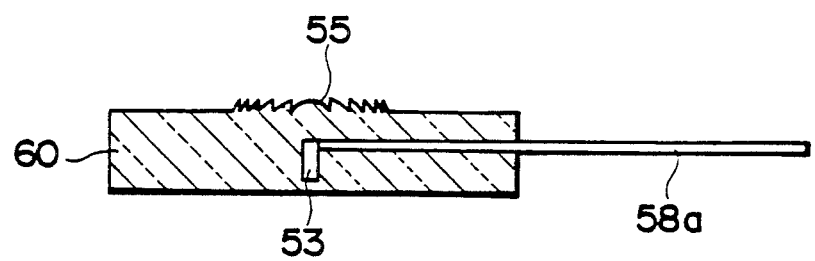
FIG. 13 is a cross-sectional view of the semiconductor light emitting apparatus.

Next, referring to FIGS. 12 and 13, a description will be given of a third embodiment in accordance with the present invention.

In this embodiment, the mold resin 60 and the micro Fresnel lens 55 are initially formed in an integral manner. That is, when manufacturing the light emitting diode of the edge emission type 53, portions of the lead frames 58a and 58b, and the lead wire 59 in the mold resin 60, the molding operation is carried out by use of a stamper in which a profile of a micro Fresnel lens is formed. As a result, the micro Fresnel lens 55 is simultaneously produced on a surface of the mold resin 60.

In this connection, depending on the distance between the light emitting point of the light emitting diode 53 and the micro Fresnel lens 55, there is fabricated an apparatus of a collimation type or a focusing type.

In this embodiment, as compared with the second embodiment, owing to the simultaneous molding operation by use of the stamper, the manufacturing cost can be lowered and the thickness of the product is be much more minimized.

In the second and third embodiments of the semiconductor light emitting apparatus, a light emitting diode 53 of the edge emitting type is vertically mounted on an upper surface of the mold resin 60. A configuration of the emitted light (a collimated or focused light) is adjustable depending on the distance between the light emitting diode 53 and the micro Fresnel lens 55. In consequence, for obtaining the desired configuration of light, the pertinent distance is required to be reserved. Namely, these conditions impose a restriction on the minimization of the thickness of the mold resin 60.

Next, a description will be given of an embodiment of a semiconductor light emitting apparatus in which the thickness of the apparatus can be further reduced.

Figure 14:
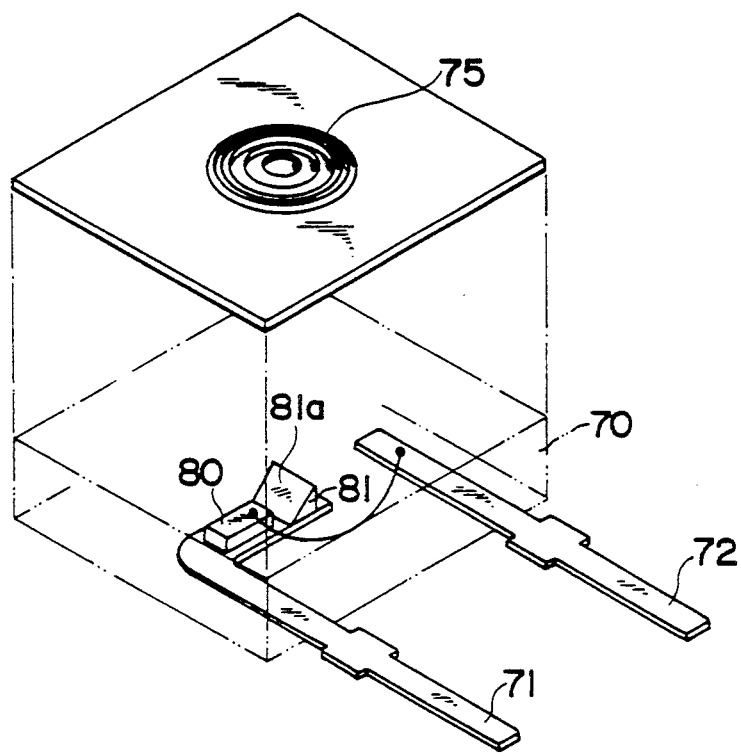
FIGS. 14 and 15 are diagrams related to a fourth embodiment of a semiconductor light emitting apparatus in accordance with the present invention.
Figure 15:
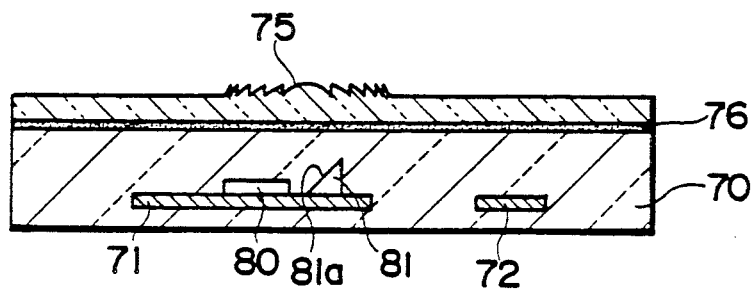

FIGS. 14 and 15 show a fourth embodiment of the light emitting device.

The constitution of these diagrams include a light emitting element 80 of an edge emission type, which may be implemented by use of a light emitting diode of an edge emitting type or a semiconductor laser. On a bottom surface of the light emitting element 80, there is disposed a layer of a negative (minus) electrode, which is bonded onto a surface of an inner end portion of a lead terminal 71 having an L shape. A positive (plus) electrode disposed on an upper surface of the light emitting element 80 is connected via a bonding wire to an inner end portion of a lead terminal 72 having an I shape. The lead terminals 71 and 72 are enbedded through a sealing operation in a package 70 formed in a parallelepiped with an optically transparent resin. End portions of the lead terminals 71 and 72 are projected toward an external space. Onto an upper surface of the package 70, a planar micro Fresnel lens 75 is fixed by use of a transparent adhesive agent 76.

In a space before a light emitting end of the light emitting element of the edge emission type 80, a reflection member 81 having a cross section of a substantially triangular shape is arranged on a tip end portion of the inner end of the L-shape lead terminal 71. The reflection stand 81 has an inclined surface 81a facing a light emitting end of the light emitting element 80. The inclined surface 81a is coated with a reflective layer, which is formed with a material such as gold (Au) or aluminum (Al) having a high reflective characteristic. In this configuration, the reflect means is constituted with the reflection member 81 and the reflection layer 81a.

In order to align the optical axis of a light reflected from the reflect means with that of the micro Fresnel lens 75, a position where the reflection member 81 is placed and an inclination angle of the inclined surface 81a are to be appropriately determined.

In consequence, in the semiconductor light emitting device above, the light irradiated from the light emitting element 80 propagates toward an end surface of the package 70 and is then reflected on the inclined surface 81a of the reflection stand 81 in a direction different from the original propagation direction by a substantially right angle. The light is resultantly introduced toward the upper side of the package 70 to be emitted via the micro Fresnel lens 75 disposed on the upper surface thereof into an external space. As above, the light emitting element 80 of the edge emission type is arranged in a posture in which the light emitting element 80 lies on its side, namely, not in the standing posture; moreover, the light conducting path or waveguide is deflected. In consequence, a long distance can be reserved for the light conducting route, which as a result enables the distance between the light emitting element 80 and the micro Fresnel lens 75 to be reduced to the possible extent. This advantageously contributes to the reduction of the thickness of the apparatus.

Figure 16:
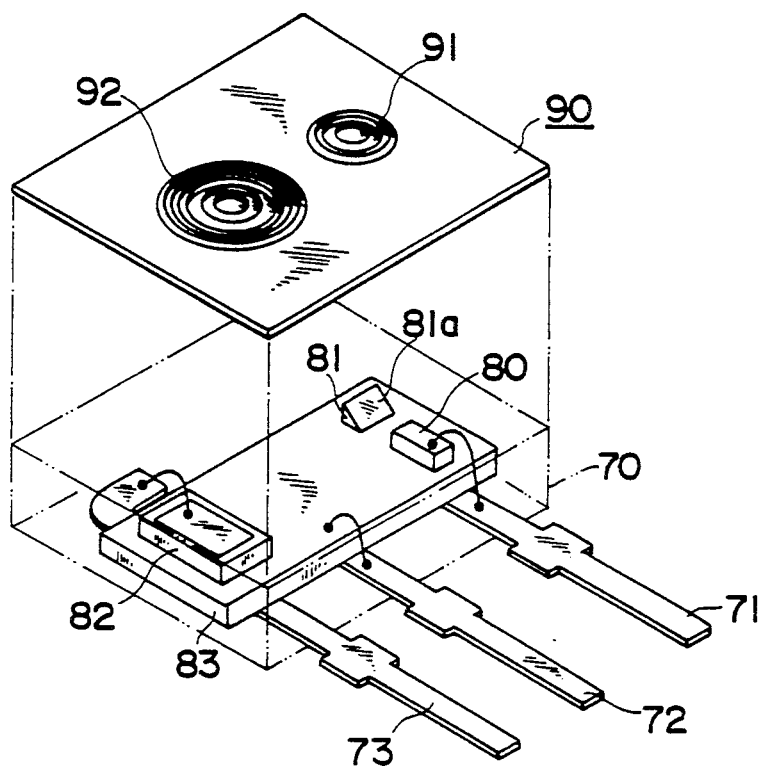
FIGS. 16 and 17 are diagrams associated with a fifth embodiment associated with a reflective photosensor in accordance with the present invention.
Figure 17:
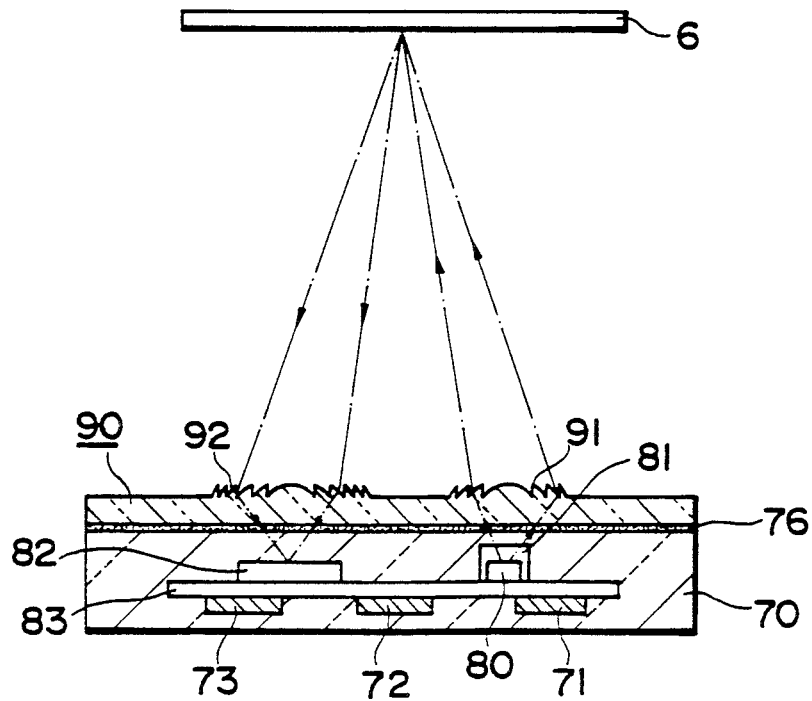

Subsequently, referring to FIGS. 16 and 17, a description will be given of a fifth embodiment of the semiconductor light emitting apparatus or device according to the present invention. In this example, like in the case of the fourth embodiment, a light receiving element is integrally formed in the semiconductor light emitting device to implement a reflective photosensor. In the fifth embodiments, the same constituent parts and components as those of the fourth embodiment are assigned with the same reference numerals and a detailed description thereof will be avoided.

As shown here, a light receiving element 82 is mounted together with a light emitting element of an edge emission type 80 on an insulator substrate 83, which possesses an electrically conductive layer fixed on a surface thereof. The conductive layer on the surface of the insulator substrate 83 is linked with, for example, negative (minus) electrodes respectively of the elements 80 and 82. The conductive layer is connected to a lead terminal 72. Furthermore, positive (plus) electrodes respectively of the light emitting element 80 and the light receiving element 82 are respectively connected via bonding wires to lead terminals 71 and 73 each functioning as a signal terminal.

The constitution includes a micro Fresnel lens 90 comprising a Fresnel lens section 91 for the light emitting element 80 and a Fresnel lens section 92 associated with the light receiving element 82. In this configuration, reflect means is attached onto the insulation substrate 83.

The operation of the reflective photosensor will now be described.

A light emitted from the light emitting element 80 is reflected by the reflect means to be passed through the Fresnel lens section 91 of the micro Fresnel lens 90. The light is projected into an external space while being thereby focused. The resultant light is reflected on a target surface 6 in the external space so as to be fed through the Fresnel lens section 92 of the micro Fresnel lens 90. The light is delivered to a light receiving surface of the light receiving element 82 while being thus focused.

The reflective photosensor is employed, for example, to sense presence or absence of a object sensed, to measure a size of the object sensed, or to determine a distance between the sensor and the object sensed.

Figure 18:
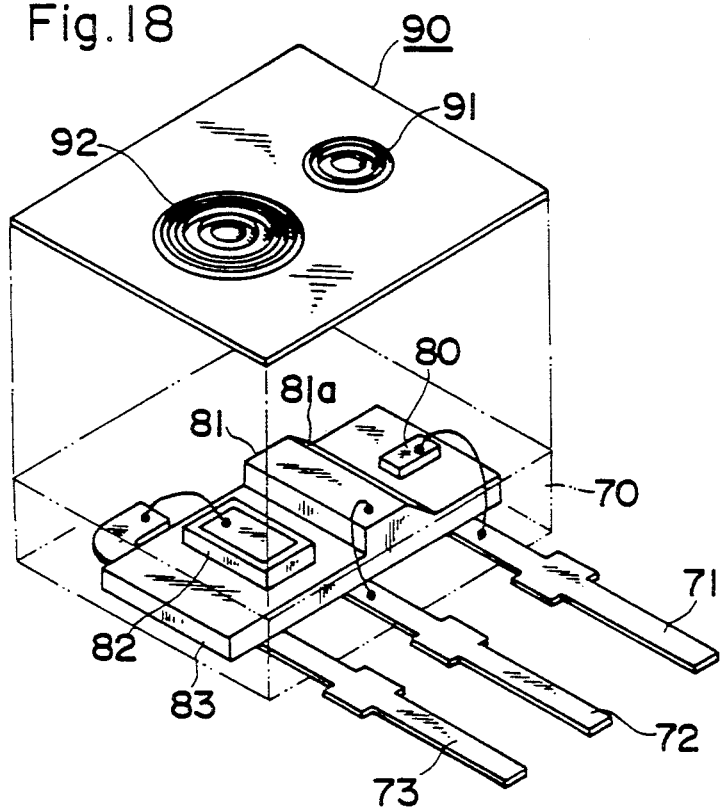
FIGS. 18 and 19 are diagrams associated with a sixth embodiment related to a reflective photosensor in accordance with the present invention.
Figure 19:
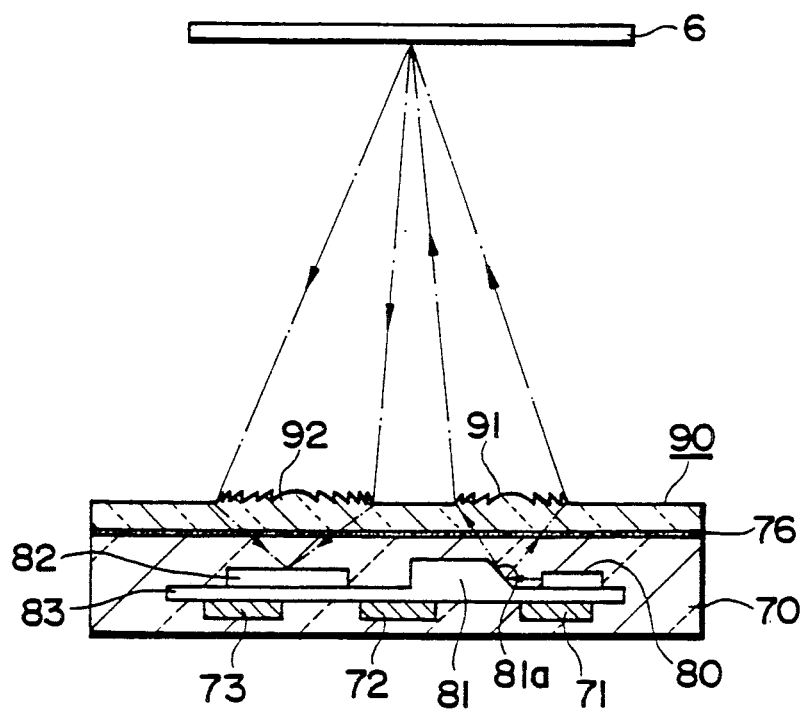

Referring next to FIGS. 18 and 19, a description will be given of a sixth embodiment of the semiconductor light emitting apparatus or device in accordance with the present invention.

The constitution of the sixth embodiment is different from that of the fifth embodiment in that reflect means is inserted between a light emitting element of an edge transmitting type 80 and a light receiving element 82. The reflect means is integrally formed with an insulator substrate 83. Namely, on the insulator substrate 83, an electrically conductive film or layer is formed; thereafter, the reflection film above is deposited only on an inclined surface 81a of a reflection member 81 constituting the reflect means. Thanks to the reflect means disposed between the light emitting element 80 and the light receiving element 82, an optical separation between the light emitting element 80 and the light receiving element 82 is more suitably achieved. This consequently leads to an advantage that a dark current associated with an interference between lights can be minimized.

Figure 20:
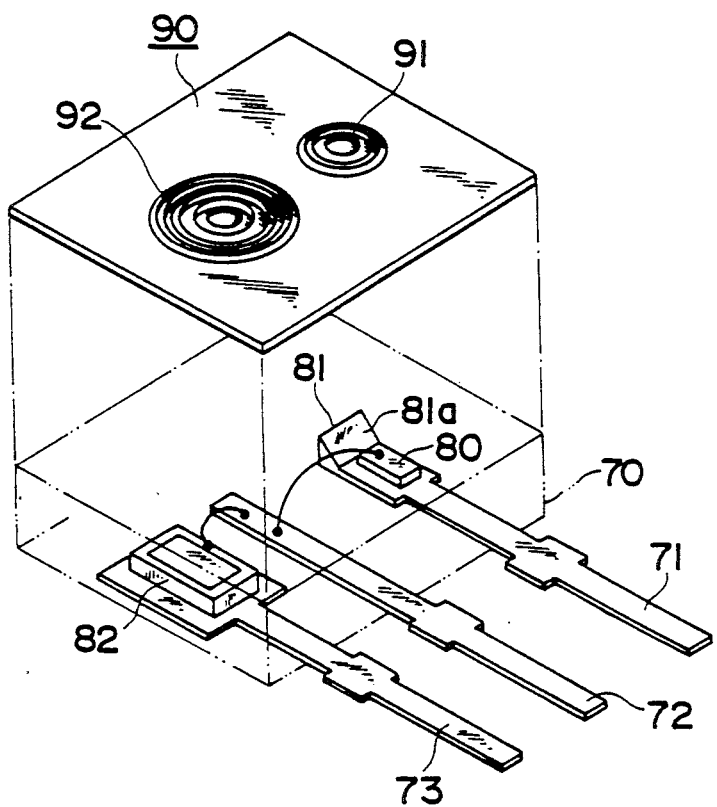
FIG. 20 is a partially disassembled perspective view of a reflective photosensor related to a seventh embodiment in accordance with the present invention.

Furthermore, FIG. 20 shows the configuration of a seventh embodiment of the semiconductor light emitting device in accordance with the present invention. The constitution of this embodiment does not include the insulator substrate 83 employed in the sixth embodiment. Namely, a light emitting element of an edge emission type 80 and a light receiving element 82 are directly bonded onto lead terminals 71 and 73, respectively. Moreover, in this structure, in an inner end portion of the lead terminal 71 on which the light emitting element 80 is mounted, a reflection member or stand 81 is integrally formed as a reflect means. Since the configuration particularly makes unnecessary the insulator substrate, the number of constituent parts as well as the thickness of the package can be much more reduced as compared with the other reflective photosensors.

Figure 21:
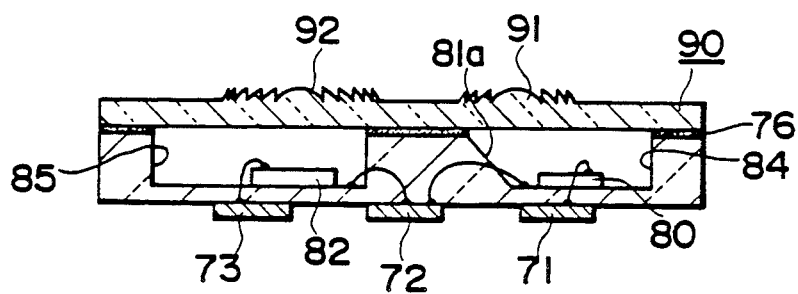
FIG. 21 is a cross-sectional view showing an eighth embodiment in accordance with the present invention.
Figure 22:
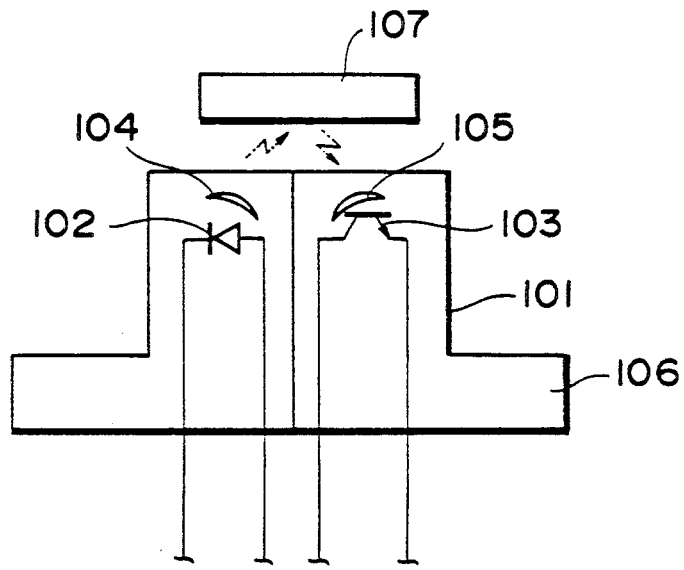
FIG. 22 is a configuration diagram showing the constitution of a reflective photosensor in a conventional example.
Figure 23:
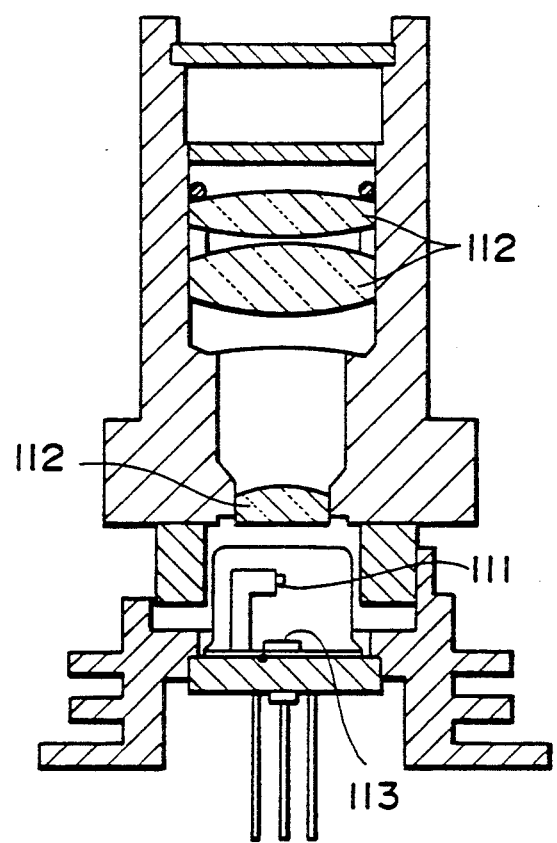
FIG. 23 is a cross-sectional view of a semiconductor light emitting apparatus of a conventional example.

FIG. 21 shows the configuration of an eighth embodiment of a semiconductor light emitting device in accordance with the present invention. In this embodiment, lead terminals 71, 72, and 73, a light emitting element of an edge emission type 80, and a light receiving element 82 are not manufactured together with a package 70. Namely, two depressed or recessed portions 84 and 85 are first formed in the package 70 and then the light emitting element of an edge emission type 80 and a light receiving element 82 are arranged on the depressed portions 84 and 85, respectively. Subsequently, a micro Fresnel lens 90 is fixed onto the package 70 by use of a transparent adhesive agent 76 so as to cover the depressions 84 and 85. The depressed portion 84 has an inclined inner surface 81a, which serves as reflect means. The inclined surface 81a is coated with a reflection layer. Electrically conductive films are respectively deposited on at least bottom portions of the recesses 84 and 85, respectively. The condutive films are respectively linked with electrode layers disposed on bottom surfaces of the light emitting element 80 and the light receiving element 82, respectively. The conductive layers respectively of the depressed portions 84 and 85 are connected via bonding wires to the lead terminal 72. Electrode layers disposed on upper surfaces respectively of the elements 80 and 82 are linked via respective bonding wires to the lead terminals 71 and 73. In this connection, the spaces respectively of the depressed portions 84 and 85 are favorably filled with a gas such as $N_2$. In this embodiment, the respective projected portions of the Fresnel lens sections 91 and 92 may also be formed not to be projected into the external space. Namely, these projected portions are disposed to respectively face the depressed portions 84 and 85 of the package 70. This prevents dusts and dirts from being accumulated between the projections respectively constituting the Fresnel lens sections 91 and 92 so as to avoid any damages. Moreover, when an electrically conductive material is adopted to form the reflective film disposed on the inclined surface 81a of the depressed portion 84, the electrically conductive films on the bottom surfaces respectively of the depressions 84 and 85 may also be formed with the identical conductive material at the same time.

While particular embodiments of the invention have been shown and described, it will be obvious to those skilled in the art that various changes and modifications may be made without departing from the present invention in its broader aspects.

What is claimed is:

1. A reflective photosensor comprising:
   a housing body, including a substrate, formed with a window at a top thereof, the housing body accommodating therein a light emitting element having first and second light emitting surfaces on opposite sides, a first light receiving element, a second light receiving element, and a planar optical element;
   a transparent member covering said window;
   said substrate including a support member accommodated in said housing body;
   said light emitting element and first light receiving element being mounted on said support member, such that a light receiving surface of said first light receiving element is located at a position having a shorter distance to said planar optical element as compared with said first light emitting surface of the light emitting element;
   said second light receiving element being mounted on the substrate to receive a light emitted from said second light emitting surface of said light emitting element and to output a monitor signal to control said light emitting element;
   said planar optical element having:
      a first micro Fresnel lens portion for projecting a light emitted from said first light emitting surface of said light emitting element toward an object to be sensed in an external space; and
      a second micro Fresnel lens portion for introducing a reflection light reflected from said object to said light receiving surface of the first light receiving element.

2. A reflective photosensor in accordance with claim 1, wherein a diameter of said second micro Fresnel lens portion is larger than that of said first micro Fresnel lens portion.

3. A reflective photosensor in accordance with claim 1, wherein said planar optical element serves as the transparent member mounted on the housing body so as to cover the window.

4. A reflective photosensor comprising:
   an insulation substrate;
   an electrically conductive film formed on an upper surface of the insulation substrate;
   a light emitting element arranged on the conductive film;
   a light receiving element arranged on the conductive film;
   an optically transparent molded resin in which the substrate, conductive film, light emitting element and receiving element are embedded;
   a plurality of leads, each having one end attached to a lower surface of the insulation substrate and a second end outside of said molded resin to be exposed, electrically connected to said conductive film, light emitting element and light receiving element; and
   a planar optical element attached to an upper surface of said molded resin, having:
      a first micro Fresnel lens portion for projecting a light emitted from said light emitting element toward an object to be sensed in an external space; and
      a second micro Fresnel lens portion for introducing a reflection light reflected from said object to the light receiving element.

5. A reflective photosensor in accordance with claim 4, wherein said planar optical element is integrally formed with said molded resin.

6. A reflective photosensor in accordance with claim 4, wherein a diameter of said second micro Fresnel lens portion is larger than that of said first micro Fresnel lens portion.

7. A reflective photosensor in accordance with claim 4, comprising:

a package formed by said optically transparent molded resin, having an external contour substantially identical to a flat parallelepiped;

said light emitting element, being of an edge emitting type, arranged in the package in a posture in which light emitted therefrom is substantially parallel to an upper surface of the package; and reflect means disposed in the package for reflecting said light emitted from said light emitting element toward said first micro Fresnel lens portion.

8. A reflective photosensor in accordance with claim 7, wherein said reflect means is integrally formed with said substrate.

9. A reflective photosensor in accordance with claim 7, wherein said reflect means is disposed between said light emitting element and said light receiving element.

10. A reflective photosensor comprising:
an insulation substrate;
an electrically conductive film formed on an upper surface of the insulation substrate;
a light emitting element arranged on the conductive film;
a light receiving element arranged on the conductive film;
an optically transparent molded resin in which said substrate, conductive film, light emitting element and light receiving element are embedded, said molded resin being formed with a recesses above said light emitting element and the light receiving element;
a plurality of leads, each having one end attached to a lower surface of the insulation substrate and a second end extended outside said molded resin to be exposed, each of said leads being respectively electrically connected to said conductive film; light emitting element and light receiving element; and
a planar optical element having:
a first micro Fresnel lens portion for projecting a light emitted from the light emitting element toward an object to be sensed in an external space; and
a second micro Fresnel lens portion for introducing a reflection light reflected from said object to said light receiving element;
the planar optical element being attached to an upper portion of the molded resin such that Fresnel lens patterns of said first and second micro Fresnel lens portions face said areas within said recesses.

11. A reflective photosensor in accordance with claim 10, wherein a gas such as $N_2$ is filled in the space of the recess.

12. A reflective photosensor in accordance with claim 10, wherein a diameter of said second micro Fresnel lens portion is larger than that of said first micro Fresnel lens portion.

13. A reflective photosensor in accordance with claim 10, comprising:
a package formed by said optically transparent molded resin having an external contour substantially identical to a flat parallelepiped;
said light emitting element, being of an edge emitting type, arranged in said package in a posture in which light emitted therefrom is substantially parallel to an upper surface of said package; and
reflecting means disposed in said package for reflecting thereon said light emitted from an end of said light emitting element toward the first micro Fresnel lens portion.

14. A reflective photosensor in accordance with claim 13, wherein said reflecting means is integrally formed with the substrate.

15. A reflective photosensor in accordance with claim 13, wherein said reflecting means is disposed between said light emitting element and said light receiving element.

16. A reflective photosensor comprising:
at least three leads;
a light emitting element fixed on one end of a first of said leads;
a light receiving element fixed on one end of second of said leads;
a reflecting means arranged on said one end of said first lead ajacent to said light emitting element;
an optically transparent molded resin in which one end of each of said leads, said light emitting element, said light receiving element and said reflect means are embedded, said molded resin being formed to have an external contour substantially identical to a flat parallelepiped, said leads extending to outside of a molded resin to be exposed at respective other ends thereof;
said the first lead being electrically connected to one electrode of said light emitting element;
said second lead being electrically connected to one electrode of said light receiving element;
said third lead being electrically connected to second electrodes of both said light emitting element and said light receiving element;
a planar optical element having:
a first micro Fresnel lens portion for projecting a light emitted from the light emitting element toward an object to be sensed in an external space; and
a second micro Fresnel lens portion for introducing a reflection light reflected from the object to the light receiving element;
said planar optical element being attached to an upper surface of said molded resin;
said light emitting element being of an edge emitting type and being arranged in the molded resin in a posture in which light emitted therefrom is substantially parallel to the upper surface of said molded resin; and
said reflecting means reflecting said light emitted from an end of said light emitting element toward said first micro Fresnel lens portion of the planar optical element.

17. A reflective photosensor in accordance with claim 16, wherein said reflecting means is integrally formed with said first lead.

18. A reflective photosensor comprising:
a package formed with two recesses;
a light emitting element disposed in said first recess;
a light receiving element disposed in said second recess;
reflecting means disposed in said first recess;
a planar optical element having:
a first micro Fresnel lens portion for projecting light emitted from said light emitting element toward an object to be sensed in an external space; and
a second micro Fresnel lens portion for introducing a reflection light reflected from said object to said light receiving element;

said planar optical element being attached to an upper portion of said package;

said light emitting element being of an edge emitting type and being arranged in said first recess in a posture in which a light emitted therefrom is substantially parallel to the surface of said planar optical element; and said reflecting means reflecting said light emitted from an end of said light emitting element toward said first micro Fresnel lens portion of said planar optical element.

19. A reflective photosensor in accordance with claim 18, wherein said first recess is formed to have an inclined inner surface which serves as said reflecting means.

20. A reflective photosensor in accordance with claim 18, wherein said planar optical element is so arranged that Fresnel lens patterns of said first and second micro Fresnel lens portions face areas within said first and second recesses, respectively.

21. A reflective photosensor in accordance with claim 18, wherein a gas such as $N_2$ is filled in the spaces of the recesses.

22. A semiconductor light emitting apparatus comprising:

a housing body, which includes a heat sink, formed with a window at a top thereof;

a transparent member covering said window;

said housing body accommodating therein a light emitting diode of an edge emitting type and a micro Fresnel lens;

said light emitting diode being attached to said heat sink;

said micro Fresnel lens being aligned with said light emitting diode with respect to respective optical axes;

said light emitting diode having a central wavelength in the vicinity of a design wavelength of said micro Fresnel lens;

light emitted from the light emitting diode passing through the micro Fresnel lens to be collimated or to be focused and projected outside through said transparent member.

23. A semiconductor light emitting apparatus comprising:

at least two leads;

a light emitting diode of an edge emitting type fixed on one end of said first lead;

said first lead being electrically connected to one electrode of said light emitting diode;

said second lead being electrically connected to another electrode of the said emitting diode;

an optically transparent molded resin in which one end of said leads and said light emitting diode are embedded, said leads extending outside of the molded resin to be exposed at respective other ends thereof; and a planner optical element having a micro Fresnel lens for projecting light emitted from said light emitting diode toward outside of said molded resin, said planar optical element being attached to an upper surface of the molded resin.

24. A semiconductor light emitting apparatus in accordance with claim 23, wherein said planar optical element is integrally formed with said molded resin.

25. A semiconductor light emitting apparatus in accordance with claim 23, comprising:

a package formed with said optically transparent molded resin having an external contour substantially identical to a flat parallelepiped;

said light emitting diode of an edge emitting type arranged in the package in a posture in which a light emitted therefrom is substantially parallel to an upper surface of said package; and reflecting means disposed in said package and on one end of said first lead for reflecting thereon a light emitted from an end of said light emitting diode toward said micro Fresnel lens.

* * * * *